(12) United States Patent
Kim et al.

(10) Patent No.: US 12,406,917 B2
(45) Date of Patent: Sep. 2, 2025

(54) SEMICONDUCTOR PACKAGE AND METHOD OF MANUFACTURING THE SEMICONDUCTOR PACKAGE

(71) Applicant: SAMSUNG ELECTRONICS CO., LTD., Suwon-si (KR)

(72) Inventors: Geunwoo Kim, Asan-si (KR); Jiwon Shin, Daejeon (KR); Donguk Kwon, Asan-si (KR); Wooram Myung, Suwon-si (KR); Kwangbok Woo, Cheonan-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 540 days.

(21) Appl. No.: 17/739,329

(22) Filed: May 9, 2022

(65) Prior Publication Data

US 2023/0091131 A1 Mar. 23, 2023

(30) Foreign Application Priority Data

Sep. 17, 2021 (KR) .................. 10-2021-0124814

(51) Int. Cl.
*H01L 23/498* (2006.01)
*H01L 21/48* (2006.01)
*H01L 23/00* (2006.01)

(52) U.S. Cl.
CPC .... *H01L 23/49838* (2013.01); *H01L 21/4857* (2013.01); *H01L 21/486* (2013.01); *H01L 23/49816* (2013.01); *H01L 23/49822* (2013.01); *H01L 23/49894* (2013.01); *H01L 24/16* (2013.01); *H01L 24/17* (2013.01); *H01L 24/81* (2013.01); *H01L 2224/16111* (2013.01); *H01L 2224/16227* (2013.01); *H01L 2224/16237* (2013.01); *H01L 2224/17104* (2013.01); *H01L 2224/17517* (2013.01); *H01L 2224/81224* (2013.01); *H01L 2224/81815* (2013.01);

(Continued)

(58) Field of Classification Search
None
See application file for complete search history.

(56) References Cited

U.S. PATENT DOCUMENTS 5,282,565 A 2/1994 Melton
5,982,630 A 11/1999 Bhatia
(Continued)

FOREIGN PATENT DOCUMENTS

JP 2003283144 A 10/2003
JP 3490851 B2 1/2004
(Continued)

*Primary Examiner* — Long Pham
(74) *Attorney, Agent, or Firm* — Sughrue Mion, PLLC

(57) ABSTRACT

Provided is a mounting substrate for a semiconductor package, including a substrate having an upper surface and a lower surface opposite to each other, the substrate including a plurality of insulation layers and wirings in the plurality of insulation layers, first substrate pads and second substrate pads on the upper surface in a chip mounting region of the mounting surface, heat absorbing pads on the upper surface in a peripheral region of the mounting surface adjacent to the chip mounting region, and connection lines in the substrate, the connection lines being configured to thermally couple the heat absorbing pads and the second substrate pads to each other.

10 Claims, 22 Drawing Sheets

(52) U.S. Cl.
CPC ............... *H01L 2924/3511* (2013.01); *H01L 2924/37001* (2013.01)

(56) References Cited

U.S. PATENT DOCUMENTS

| | | | |
|---|---|---|---|
| 7,476,976 | B2 | 1/2009 | Lange et al. |
| 9,839,127 | B2 | 12/2017 | Kwon et al. |
| 10,978,432 | B2 * | 4/2021 | Kim ................. H01L 21/565 |
| 2023/0091131 | A1 * | 3/2023 | Kim ................. H01L 23/3735 |
| | | | 257/690 |

FOREIGN PATENT DOCUMENTS

| | | |
|---|---|---|
| JP | 2007123340 A | 5/2007 |
| JP | 5691651 B2 | 4/2015 |
| KR | 1020130104743 A | 9/2013 |

\* cited by examiner

SEMICONDUCTOR PACKAGE AND METHOD OF MANUFACTURING THE SEMICONDUCTOR PACKAGE

CROSS-REFERENCE TO RELATED APPLICATION

This application claims priority under 35 U.S.C. § 119 to Korean Patent Application No. 10-2021-0124814, filed on Sep. 17, 2021 in the Korean Intellectual Property Office (KIPO), the entirety of which is herein incorporated by reference in its entirety.

BACKGROUND

1 Field

Example embodiments relate to a semiconductor package and a method of manufacturing the semiconductor package. More particularly, example embodiments relate to a semiconductor package including a semiconductor chip stacked in a flip chip bonding manner and a method of manufacturing the same.

2. Description of Related Art

In a flip chip bonding method using convection reflow equipment, since heat is applied to the entire substrate or board, thermal stresses applied to a semiconductor chip may be significantly increased. In order to reduce the thermal stresses, laser assisted bonding (LAB) technology may be used. In the LAB equipment, a laser may be irradiated onto the semiconductor chip disposed on a mounting substrate to reflow a solder. However, since the laser is scanned in a very short time, there is a problem in that a target temperature by the laser must be set high for bonding quality.

SUMMARY

Example embodiments provide a mounting substrate for a semiconductor package having structural stability and improved electrical properties.

Example embodiments provide a semiconductor package including the mounting substrate.

Example embodiments provide a method of manufacturing the semiconductor package.

According to an aspect of an example embodiment, there is provided a mounting substrate for a semiconductor package, including a substrate having an upper surface and a lower surface, the substrate including a plurality of insulation layers and wirings respectively in the plurality of insulation layers, first substrate pads and second substrate pads on the upper surface in a chip mounting region of the mounting surface, heat absorbing pads on the upper surface in a peripheral region of the mounting surface adjacent to the chip mounting region, and connection lines in the substrate, the connection lines being configured to thermally couple the heat absorbing pads and the second substrate pads to each other.

According to another aspect of an example embodiment, there is provided a semiconductor package including a mounting substrate including a substrate having an upper surface and a lower surface opposite to each other, the substrate including wirings in a plurality of insulation layers, first substrate pads and second substrate pads on the upper surface in a chip mounting region of the mounting surface, heat absorbing pads on the upper surface in a peripheral region of the mounting surface adjacent to the chip mounting region, and connection lines configured to thermally couple the heat absorbing pads and the second substrate pads to each other, a semiconductor chip in the chip mounting region of the mounting substrate, and first bumps and second bumps between the semiconductor chip and the mounting substrate, the first bumps and the second bumps being bonded to the first substrate pads and the second substrate pads, respectively, wherein the second bumps are thermally connected to the heat absorbing pad by the connection lines and the second substrate pads, respectively.

According to another aspect of an example embodiment, there is provided a method of manufacturing a semiconductor package, including forming first bumps on chip pads on a first surface of a semiconductor chip, forming second bumps on an insulation layer pattern on the first surface of the semiconductor chip, forming a mounting substrate including forming a substrate having an upper surface and a lower surface opposite to each other and including wirings in a plurality of insulation layers, forming first substrate pads and second substrate pads on the upper surface in a chip mounting region of the mounting substrate, forming heat absorbing pads on the upper surface in a peripheral region of the mounting substrate adjacent to the chip mounting region, and forming connection lines thermally coupling the heat absorbing pads and the second substrate pads to each other, providing the semiconductor chip in the chip mounting region of the substrate, and irradiating laser on the mounting substrate to bond the first bumps and the second bumps to the first substrate pads and the second substrate pads, respectively.

BRIEF DESCRIPTION OF THE DRAWINGS

Example embodiments will be more clearly understood from the following detailed description taken in conjunction with the accompanying drawings:

FIGS. 1 to 24 represent non-limiting example embodiments as described herein.

DETAILED DESCRIPTION OF EXAMPLE EMBODIMENTS

Hereinafter, example embodiments will be explained in detail with reference to the accompanying drawings.

Embodiments described herein are example embodiments, and the present disclosure is not limited thereto.

It will be understood that when an element or layer is referred to as being "over," "above," "on," "below," "under," "beneath," "connected to" or "coupled to" another element or layer, it can be directly over, above, on, below, under, beneath, connected or coupled to the other element or layer or intervening elements or layers may be present. In contrast, when an element is referred to as being "directly over," "directly above," "directly on," "directly below," "directly under," "directly beneath," "directly connected to" or "directly coupled to" another element or layer, there are no intervening elements or layers present.

Figure 1:
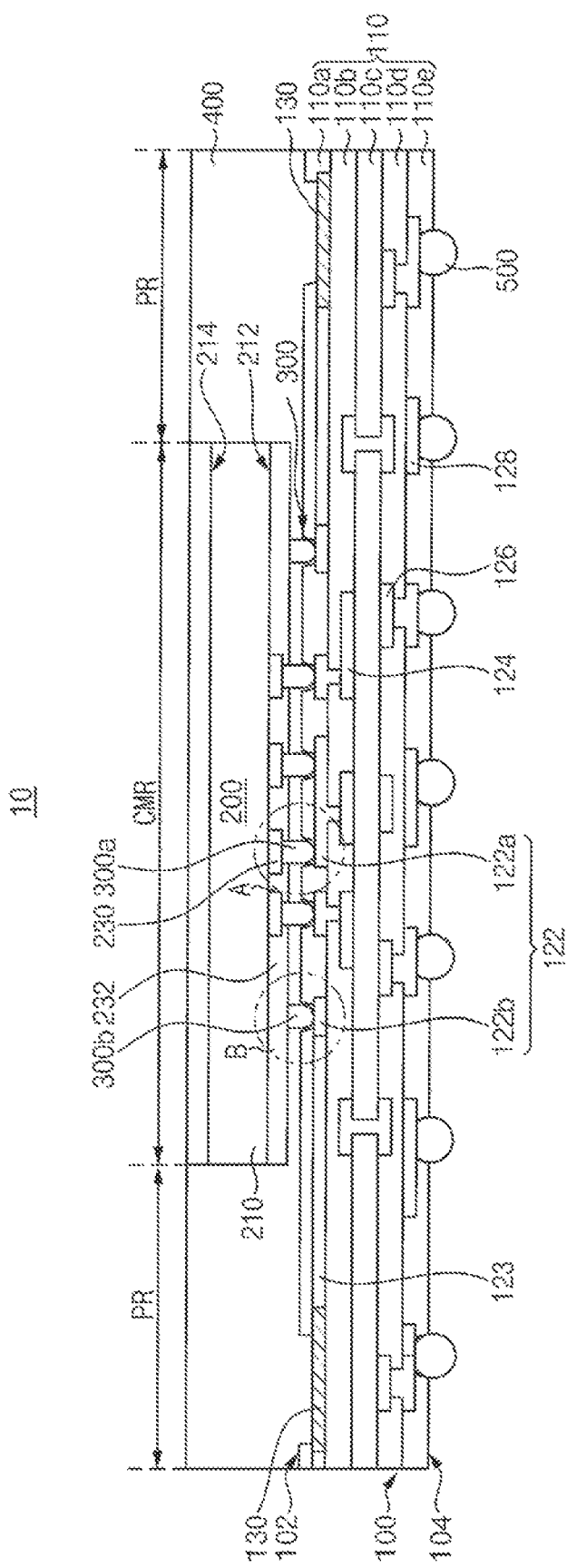
FIG. 1 is a cross-sectional view illustrating a semiconductor package in accordance with example embodiments.
Figure 2:
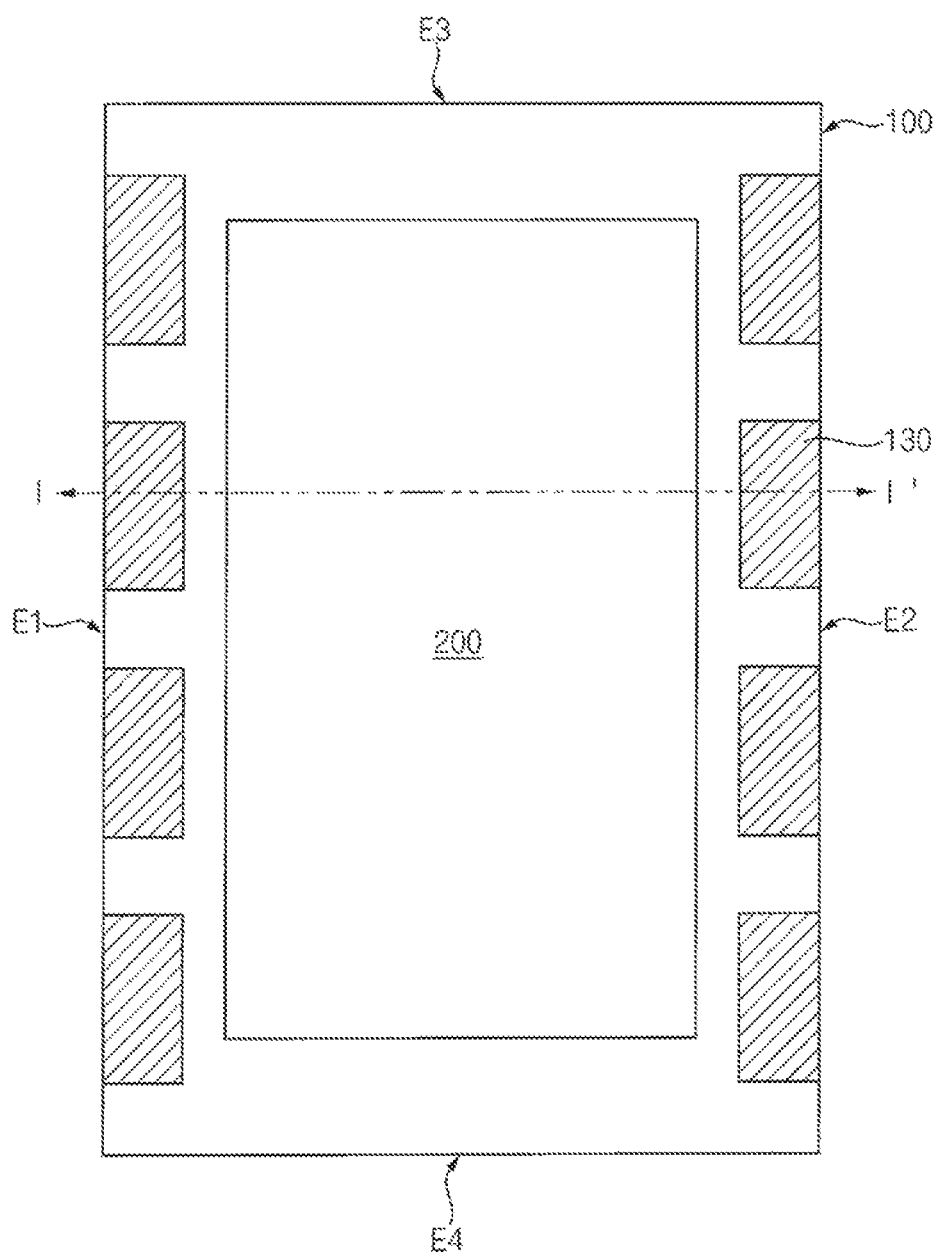
FIG. 2 is a plan view illustrating the semiconductor package in FIG. 1.
Figure 3:
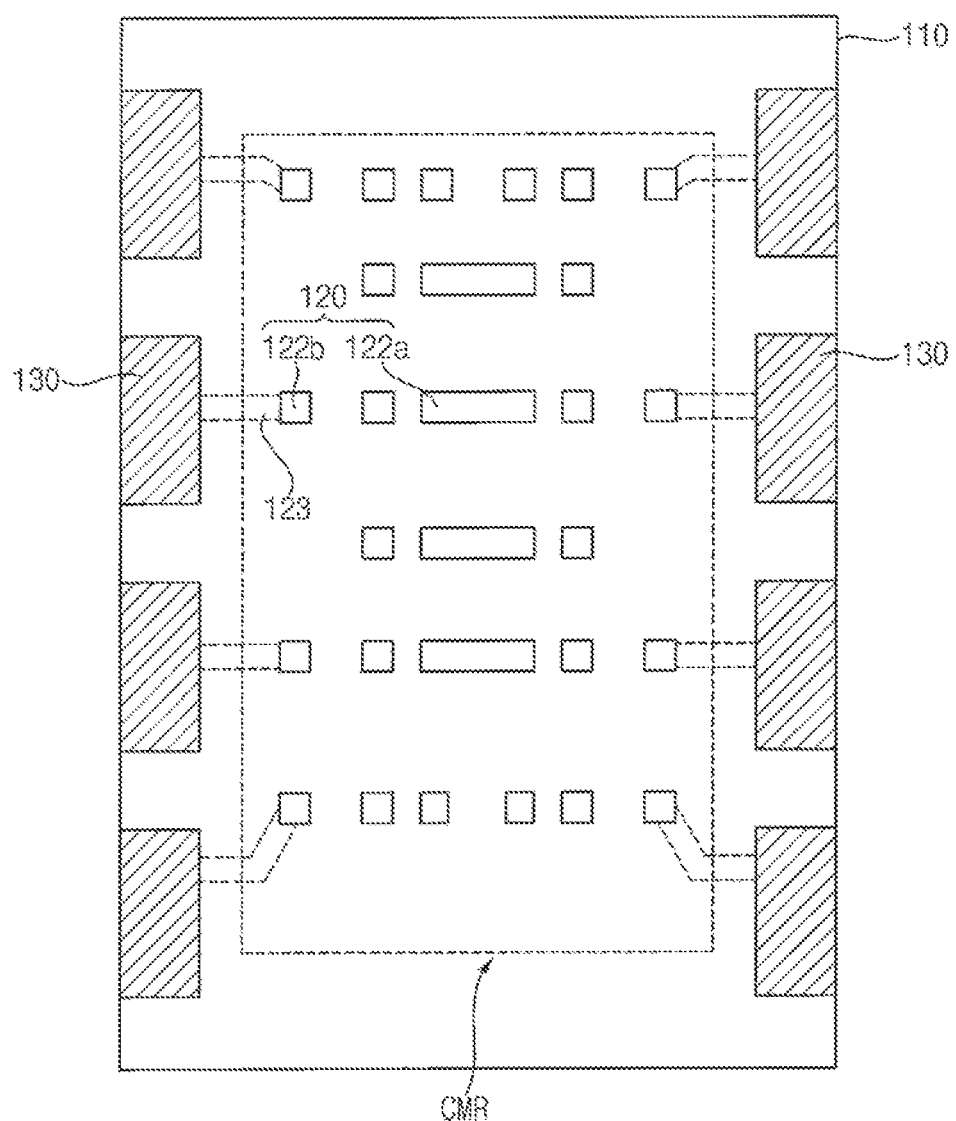
FIG. 3 is a plan view illustrating a mounting substrate of the semiconductor package in FIG. 1.
Figure 4:
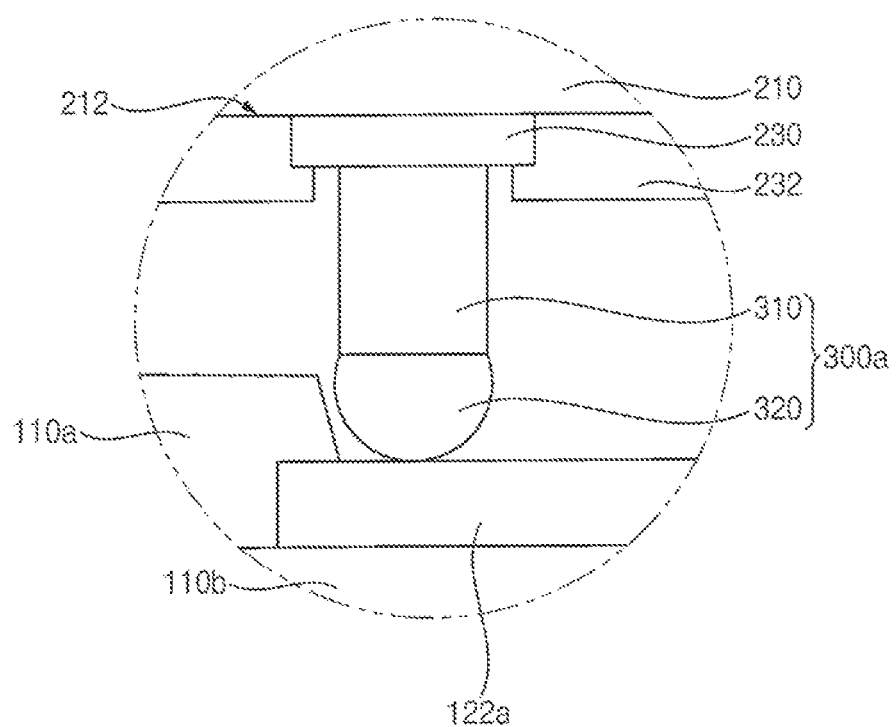
FIG. 4 is an enlarged cross-sectional view illustrating 'A' portion in FIG. 1.
Figure 5:
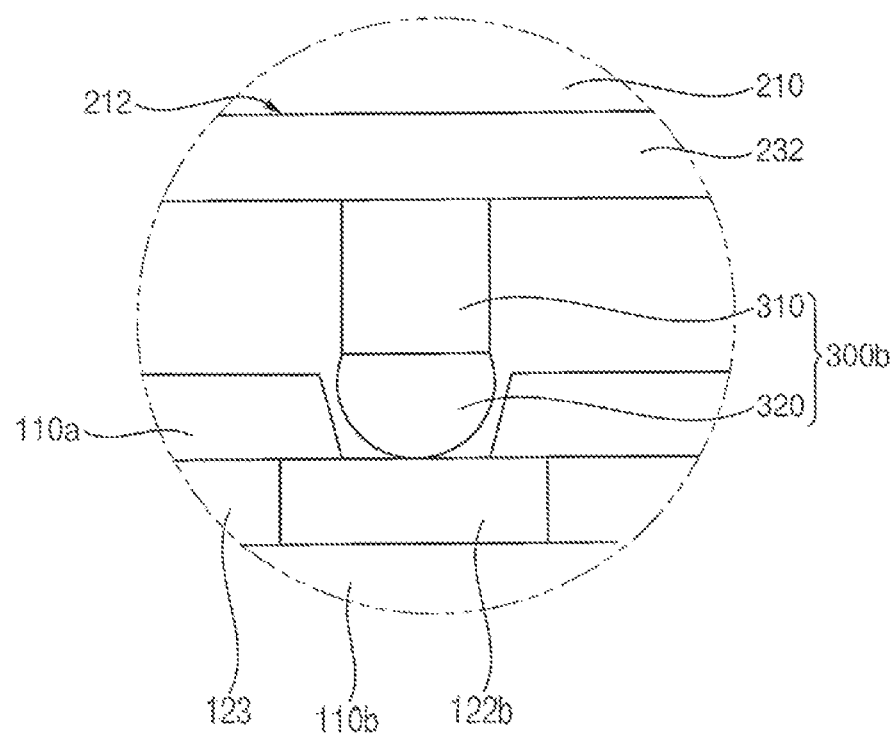
FIG. 5 is an enlarged cross-sectional view illustrating 'B' portion in FIG. 1.

FIG. 1 is a cross-sectional view illustrating a semiconductor package in accordance with example embodiments. FIG. 2 is a plan view illustrating the semiconductor package in FIG. 1. FIG. 3 is a plan view illustrating a mounting substrate of the semiconductor package in FIG. 1. FIG. 4 is an enlarged cross-sectional view illustrating 'A' portion in FIG. 1. FIG. 5 is an enlarged cross-sectional view illustrating '13' portion in FIG. 1.

Referring to FIGS. 1 to 5, a semiconductor package 10 may include a mounting substrate 100, a semiconductor chip 200, a plurality of connection members 300 and a molding member 400. The semiconductor package 10 may further include external connection members 500.

In example embodiments, the mounting substrate 100 may be a multilayer circuit board having an upper surface 102 and a lower surface 104 facing each other. For example, the mounting substrate 100 may be a printed circuit board (PCB) including wirings respectively provided in a plurality of layers and vias connected to the wirings.

In particular, the mounting substrate 100 may include a chip mounting region CMR on which the semiconductor chip 200 is mounted and a peripheral region PR surrounding and provided adjacent to the chip mounting region CMR. The mounting substrate 100 may include a plurality of stacked insulation layers 110 and wirings 120a, 120b, 120c, 120d and 120d provided respectively in the insulation layers.

The mounting substrate 100 may include a first insulation layer 110a, a second insulation layer 110b, a third insulation layer 110c, a fourth insulation layer 110d, and a fifth insulation layer 110e sequentially stacked on one another. The first insulation layer 110a may be an upper cover insulation layer, the second insulation layer 110b may be an upper insulation layer, the third insulation layer 110c may be a core layer, the fourth insulation layer 110d may be a lower insulation layer, and the fifth insulation layer 110e may be a lower cover insulation layer.

For example, the insulation layer may include an insulating material having a thermosetting resin such as epoxy resin or a thermoplastic resin such as polyimide. The insulation layer may include a resin impregnated in a core material such as organic fiber (glass fiber), for example, a prepreg, FR-4, BT (Bismaleimide Triazine), etc.

A first wiring 122 may be formed on an upper surface of the second insulation layer 110b, and a second wiring 124 may be formed on an upper surface of the third insulation layer 110c. A third wiring 126 may be formed on a lower surface of the third insulation layer 110c, and a fourth wiring 128 may be formed on a lower surface of the fourth insulation layer 110d. For example, the wirings may include a metal material such as copper, aluminum, etc. The arrangements and numbers of the insulation layers and the wiring patterns are examples, and embodiments are not limited thereto.

The first insulation layer 110a may be formed on the second insulation layer 110b to expose portions of the first wirings 122. The portions of the first wirings 122 exposed by the first insulation layer 110a may serve as substrate pads 120 to which the connecting members 300 are bonded respectively.

As illustrated in FIG. 2, the mounting substrate 100 may include a first side portion E1 and a second side portion E2 extending in a direction parallel with a first direction perpendicular to the upper surface 102 of the mounting substrate 100 and opposite to each other, and a third side portion E3 and a fourth side portion E4 extending in a direction parallel with a second direction perpendicular to the first direction and opposite to each other. The mounting substrate 100 may have a rectangular shape having a first side (shorter side) and a second side (longer side). For example, an area of the mounting substrate 100 may be greater than or equal to 10 mm×11 mm.

As illustrated in FIG. 3, the mounting substrate 100 may include the substrate pads 120 and heat absorbing pads 130 provided in the upper surface 102. The substrate pads 120 may be arranged within the chip mounting region CMR, and the heat absorbing pads 130 may be arranged in the peripheral region PR. The substrate pads 120 may include first substrate pads 122a and second substrate pads 122b. The heat absorbing pads 130 may be arranged to be spaced apart from each other along one side of the mounting substrate 100 in the first direction. The heat absorbing pads 130 may be arranged to be spaced apart from each other along the first side portion and the second side portion of the mounting substrate opposite to each other. The first substrate pads 122a may be arranged in a central region of the chip mounting region CMR, and the second substrate pads 122b may be arranged in a peripheral region of the chip mounting region CMR. However, embodiments are not limited thereto, and, for example, the second substrate pad 122b may be arranged between the first substrate pads 122a.

As illustrated in FIGS. 1 and 3, the mounting substrate 100 may further include connection lines 123 that connect the second substrate pads 122b and the heat absorbing pads 130 to each other, respectively. The heat absorbing pads 130 and the connection lines 123 may be provided in the same insulation layer. The heat absorbing pads 130 and the connection lines 123 may be formed on the upper surface of the second insulation layer 110b. The connection line 123 may include a thermally conductive material. The second substrate pad 122b may be thermally coupled to the heat absorbing pad 130 by the connection line 123. Accordingly, heat from the heat absorbing pad 130 may be transferred to the second substrate pad 122b through the connection line 123.

The heat absorbing pad 130 may have, for example, a circular plate shape or a polygonal plate shape such as quadrangle, octagon, etc. The heat absorbing pad 130 may have a larger area than an area of the substrate pad 120. The heat absorbing pad 130 may have a thickness the same as a thickness of the second substrate pad 122b. A length of one side of the heat absorbing pad 130 may be within a range of 0.5 mm to 3.0 mm. A diameter of the substrate pad 120 may be within a range of 10 μm to 80 μm.

In example embodiments, the semiconductor chip 200 may include a substrate 210 having a first surface 212 and a second surface 214 opposite to each other. Additionally, the semiconductor chip 200 may include a front insulation layer formed on the first surface 212 of the substrate 210.

For example, the substrate 210 may include may include silicon, germanium, silicon-germanium, or III-V compounds, e.g., gallium phosphide (GaP), gallium arsenide (GaAs), gallium antimonide (GaSb), etc. In some embodiments, the substrate 210 may be a silicon-on-insulator (SOI) substrate, or a germanium-on-insulator (GOI) substrate.

The semiconductor chip 200 may include circuit patterns and cells formed in the first surface 212 of the substrate 210. The circuit patterns may include a transistor, a diode, etc. The circuit patterns may constitute circuit elements. Accordingly, the semiconductor chip may be a semiconductor device in which a plurality of the circuit elements is formed.

The front insulation layer as an insulation interlayer may be provided on the first surface 212 of the substrate 210 to cover the circuit patterns. The front insulation layer may include a plurality of insulation layers and upper wirings in the insulation layers. A chip pad 230 may be provided in the outermost insulation layer of the front insulation layer. The chip pad 230 may be electrically connected to the circuit element by the upper wirings. As will be described later, at least a portion of the chip pad 230 may serve as a landing pad on which a connection member such as a signal transmission bump is disposed.

In example embodiments, the semiconductor chip 200 may be mounted on the mounting substrate 100 through the connection members 300. For example, the semiconductor chip 200 may be mounted on the mounting substrate 100 by a flip chip bonding method using a laser assisted bonding (LAB) process. In this case, the semiconductor chip 200 may be mounted on the mounting substrate 100 such that an active surface on which the chip pads 230 are formed, that is, the first surface 212 faces the mounting substrate 100.

A planar area of the semiconductor chip 200 may be smaller than a planar area of the mounting substrate 100. The semiconductor chip 200 may be arranged within the chip mounting region CMR of the mounting substrate 100. When viewed from a plan view, the heat absorbing pads 130 provided in the peripheral region PR on the upper surface 102 of the mounting substrate 100 may be exposed from the semiconductor chip 200.

In example embodiments, the connection members 300 may include first bumps 300a that are signal transmission bumps and second bumps 300b that are dummy support bumps provided on the first surface 212 of the substrate 210. When the semiconductor chip 200 is mounted on the mounting substrate 100, the first bumps 300a may be respectively bonded to the first substrate pads 122a of the mounting substrate 100, and the second bumps 300b may be respectively bonded to the second substrate pads 122b of the mounting substrate 100.

As illustrated in FIG. 4, the first bump 300a may be provided on the chip pad 230 on the first surface 212 of the substrate 210. An insulation layer pattern 232 exposing at least a portion of the chip pad 230 may be provided on the first surface 212 of the substrate 210, and the first bump 300a may be provided on the portion of the chip pad 230 exposed by the insulation layer pattern 232. The first bump 300a may be electrically connected to the circuit pattern by the chip pad and the wiring to serve as the signal transmission bump between the semiconductor chip 200 and the mounting substrate 100. For example, the insulation layer pattern may include photosensitive polyimide (PSPI). A protective layer pattern exposing the chip pad 230 may be additionally provided under the insulation layer pattern.

As illustrated in FIG. 5, the second bump 300b may be provided on the insulation layer pattern 232 that is provided on the first surface 212 of the substrate 210. The second bump 300b may be provided on a region of the insulation layer pattern 232 where the chip pads 230 are not arranged.

Because the second bumps 300b are formed on the insulation layer pattern 232, the second bumps may not be electrically connected to the circuit pattern. Accordingly, the second bump 300b may serve as dummy support bumps for supporting the semiconductor chip 200.

For example, each of the first bump 300a and the second bump 300b may include a conductive pillar 310 as a lower bump and a solder 320 as an upper bump. The conductive pillar may include a copper pillar. The solder 320 may include, for example, tin (Sn), tin/silver (Sn/Ag), tin/copper (Sn/Cu), tin/indium (Sn/In), tin/silver/copper (Sn/Ag/Cu), etc.

The first bump 300a under the semiconductor chip 200 may be electrically connected to the external connection member 500 by the first substrate pad 122a and the wirings in the mounting substrate 100. Accordingly, the semiconductor chip 200 may be electrically connected to an external device by the first bump 300a. The second bump 300b under the semiconductor chip 200 may be thermally coupled to the heat absorbing pad 130 arranged outside the semiconductor chip 200 through the second substrate pad 122b and the connection line 123.

In example embodiments, the molding member 400 may be formed on the package substrate 100 to protect the semiconductor chip 200 from the outside. The molding member may include an epoxy mold compound (EMC).

Outer connection pads configured to provide an electrical signal, that is, portions of the fourth wiring 128 exposed by the fifth insulation layer 110e, may be provided on the lower surface 104 of the mounting substrate 100. The external connection members 500 may be disposed on the outer connection pads of the mounting substrate 100 to be electrically connected with an external device. For example, the external connection member 500 may be a solder ball. The semiconductor package 10 may be mounted on a module substrate via the solder balls to constitute a memory module.

As mentioned above, the mounting substrate for the semiconductor package 100 may include the first substrate pads 122a and the second substrate pads 122b arranged in the chip mounting region CMR, and the heat absorbing pads 130 arranged in the peripheral region PR surrounding the chip mounting region CMR, and the connection lines 123 that thermally couple the heat absorbing pads 130 and the second substrate pads 122b to each other.

The semiconductor chip 200 may be mounted on the mounting substrate 100 by a flip chip bonding method using a laser assisted bonding (LAB) process. The first bump 300a serving as the signal transmission bump may be formed on the chip pad 230 of the semiconductor chip 200, and the second bump 300b serving as the dummy support bump may be formed on the insulation layer pattern 230 exposing the portion of the chip pad 230. Through the LAB process, the first bump 300a may be bonded to the first substrate pad 122a, and the second bump 300b may be bonded to the second substrate pad 122b.

Heat H due to a laser irradiated onto the heat absorbing pad 130 formed in the peripheral region PR of the mounting substrate 100, which is outside the semiconductor chip 200, may be sufficiently transferred to the second bump 300b through the connection line 123 and the second substrate pad 122b. Accordingly, the second bump 300b may be heated to a relatively higher temperature to thereby greatly improve wetting between the second bump 300b and the second substrate pad 122a. Thus, the second bump 300b may also be better bonded to the second substrate pad 122b.

As the bonding strength of the second bump is improved, a target temperature by the laser in the LAB process may be reduced. Accordingly, it may be possible to improve warpage of the substrate after the LAB process, and decrease in yield due to thermal stress may be reduced or prevented.

Hereinafter, a method of manufacturing the semiconductor package in FIG. 1 will be explained.

Figure 6:
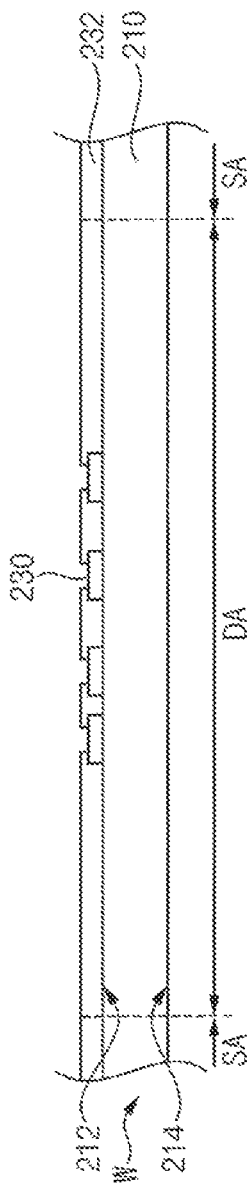
FIGS. 6, 7, 8, 9, 10, 11, 12, 13, 14, 15, 16, and 17 are views illustrating a method of manufacturing a semiconductor package in accordance with example embodiments.
Figure 7:
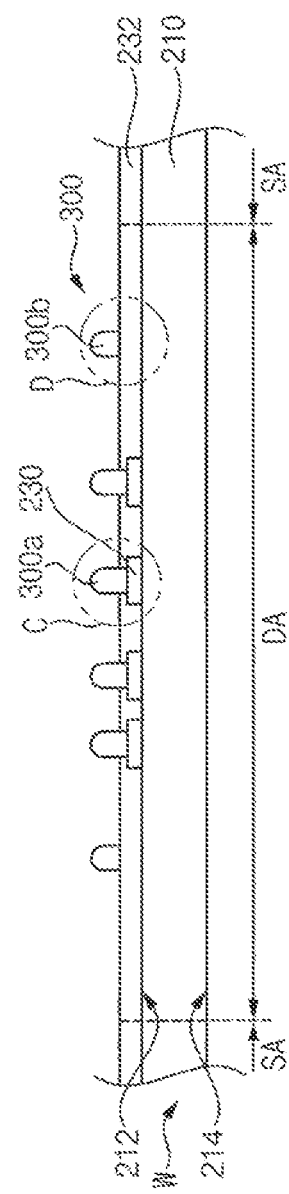
Figure 8:
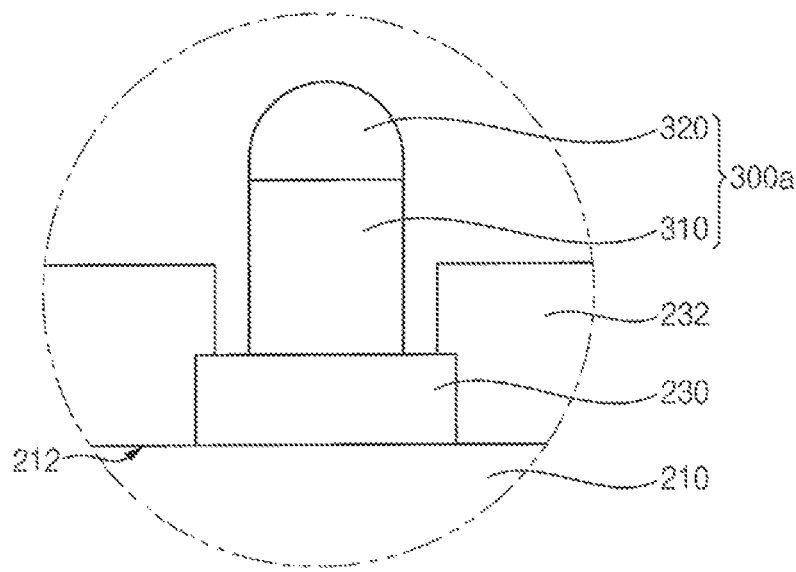
Figure 9:
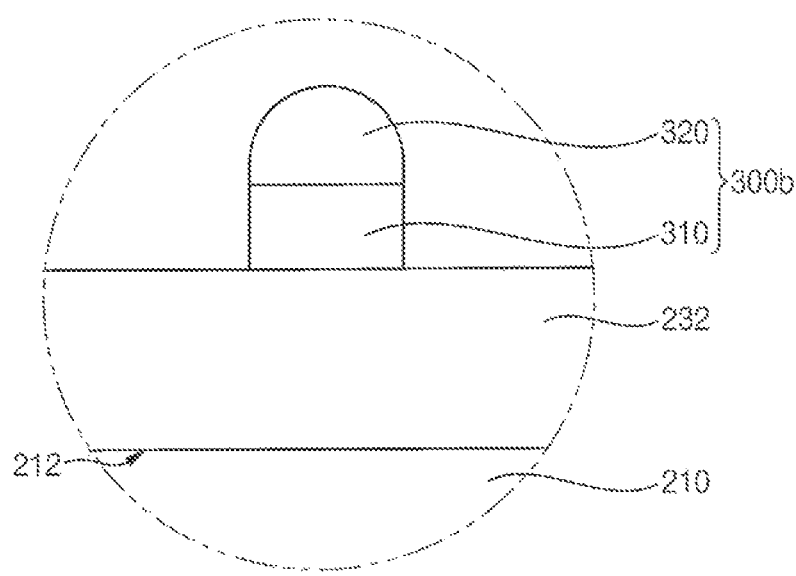
Figure 10:
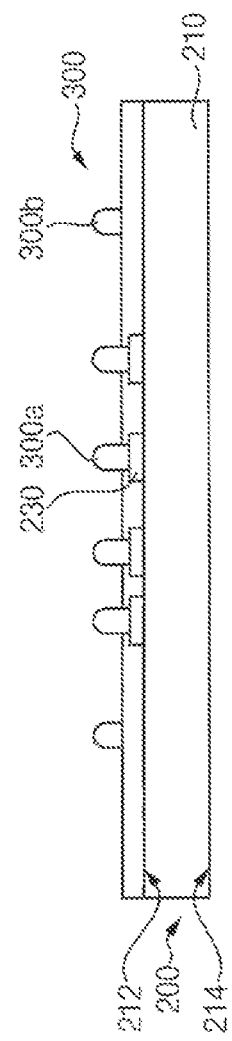
Figure 11:
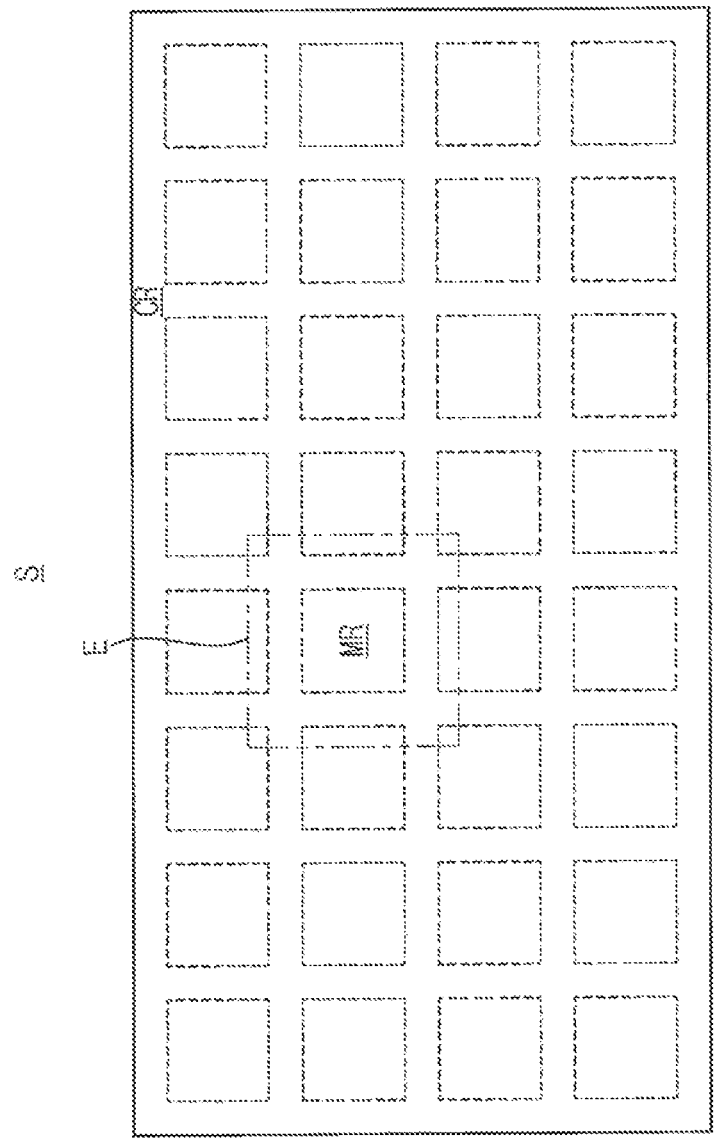
Figure 12:
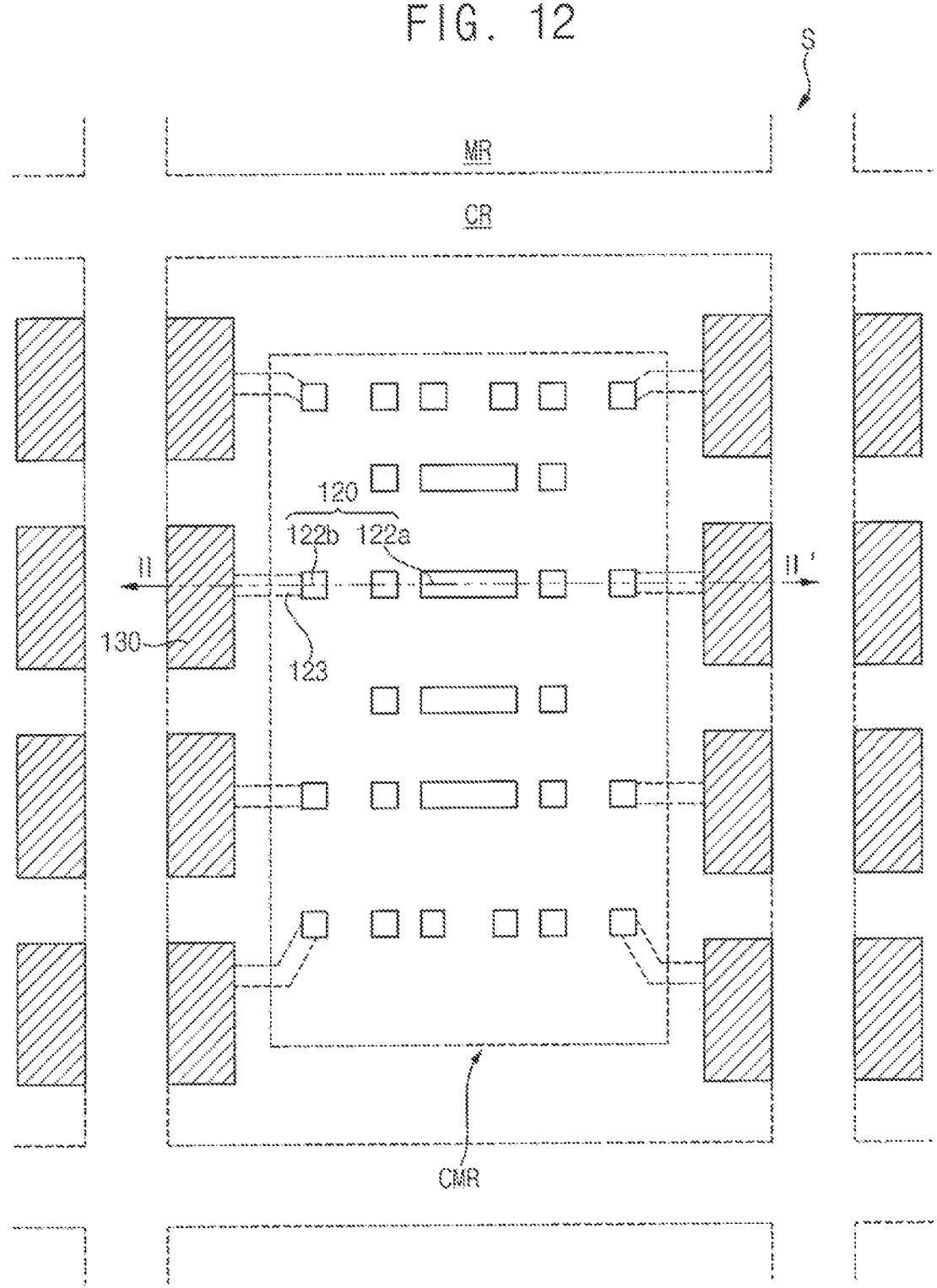
Figure 13:
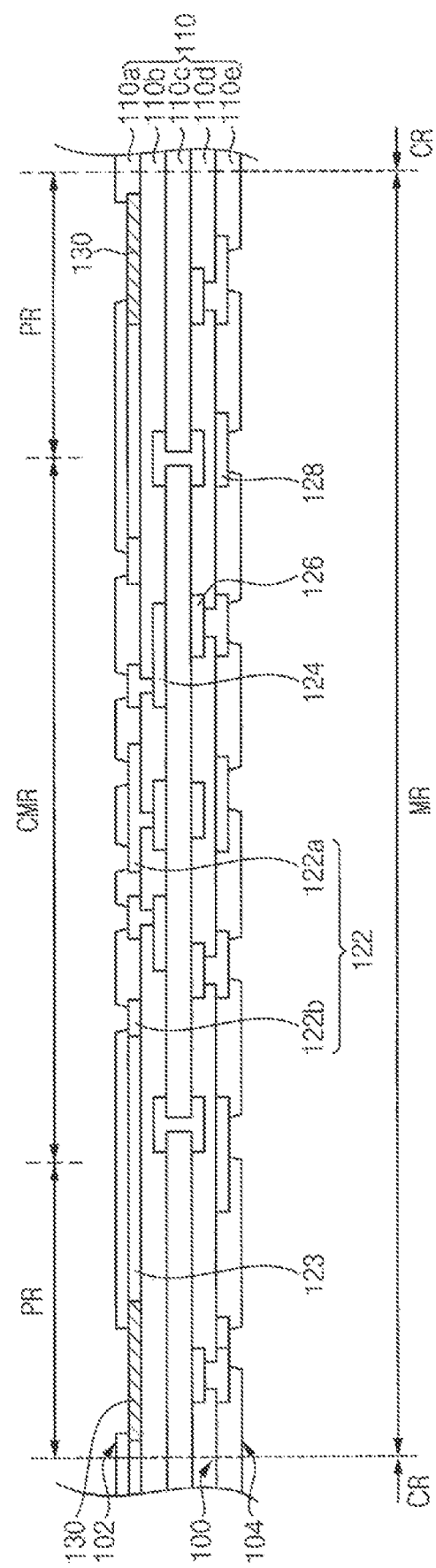
Figure 14:
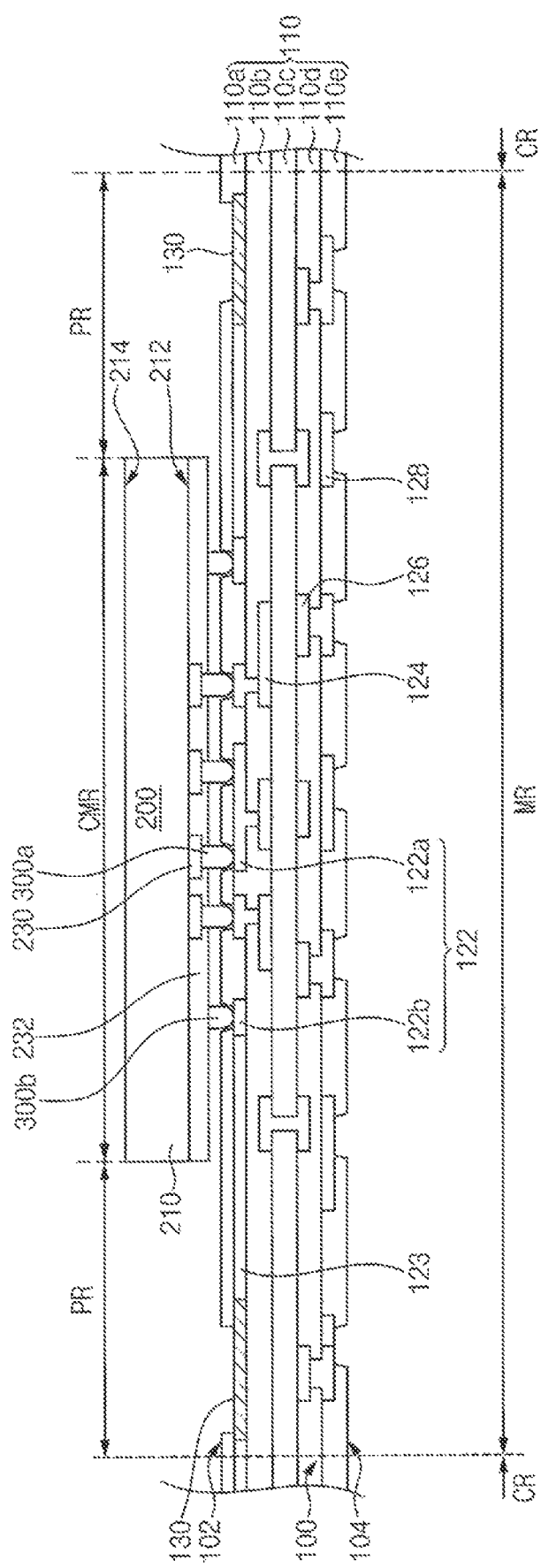
Figure 15:
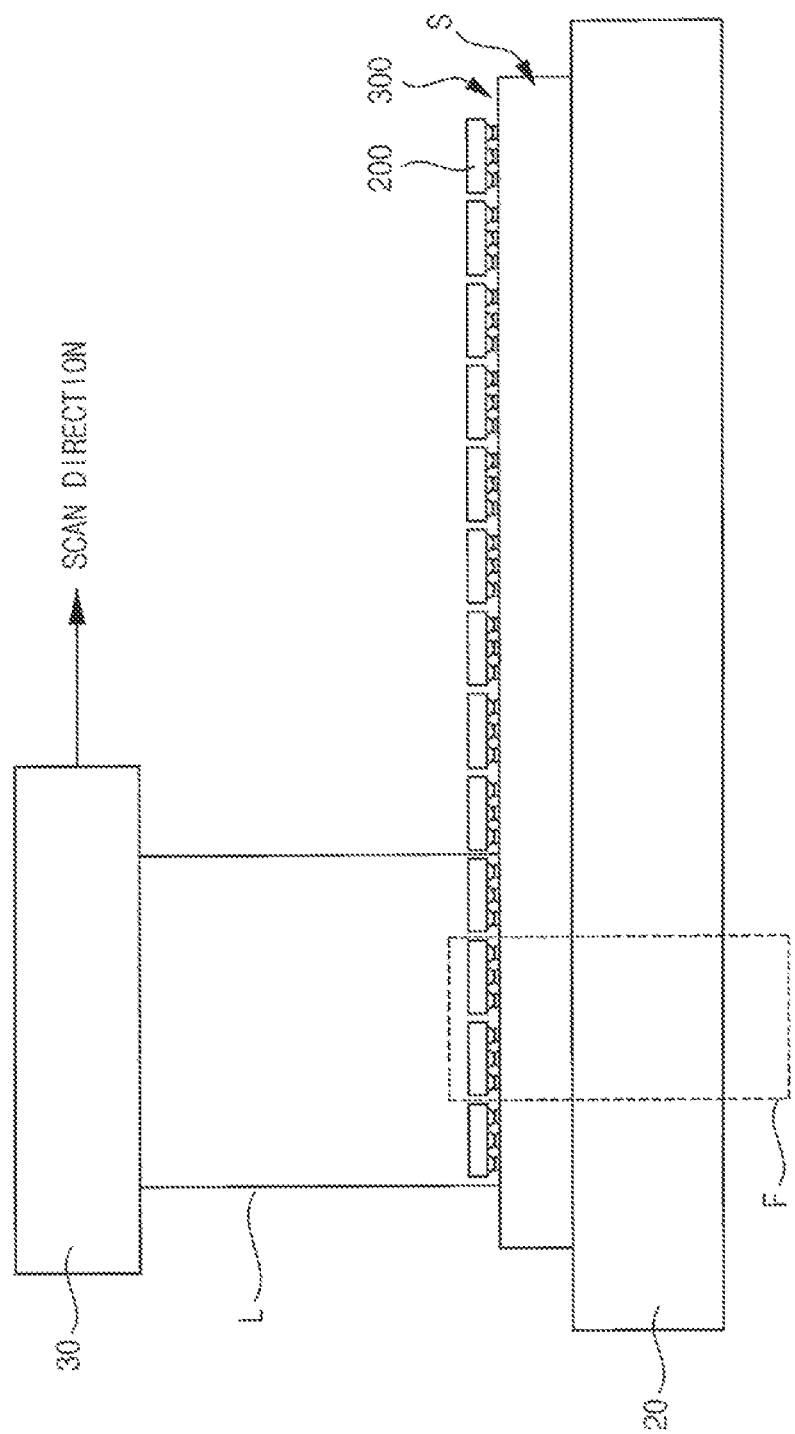
Figure 16:
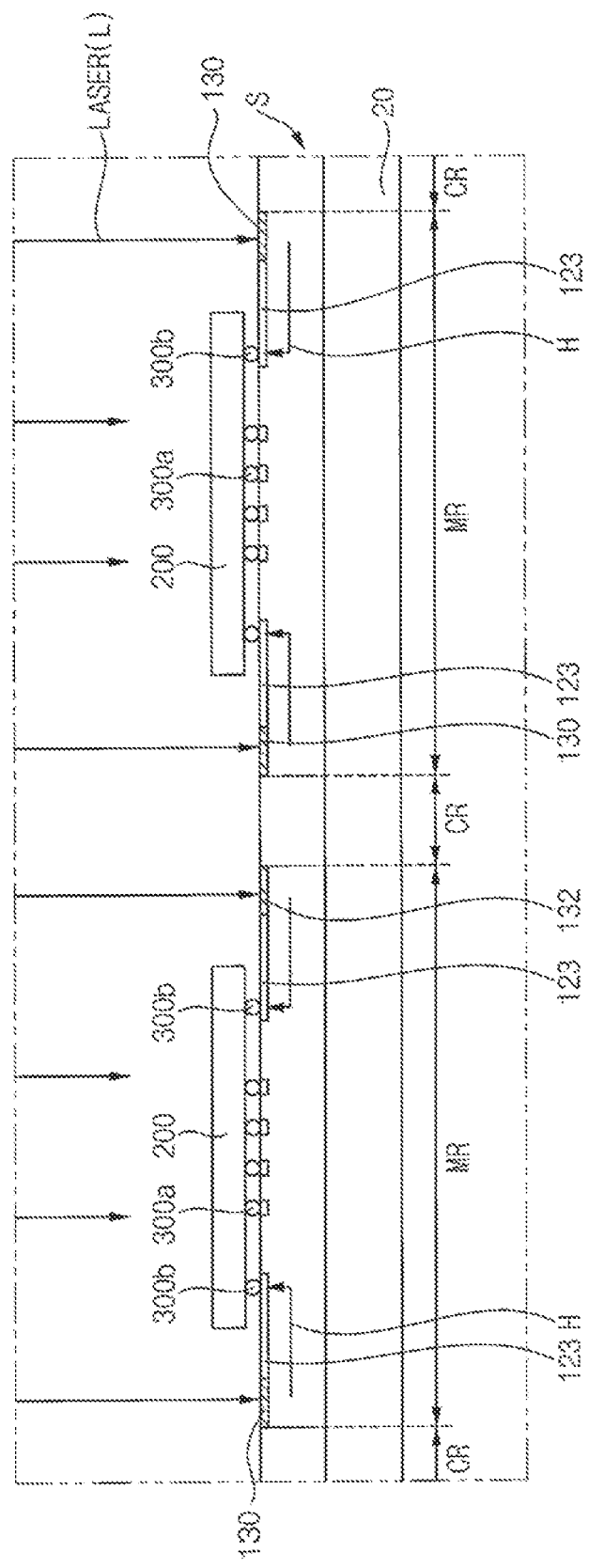
Figure 17:
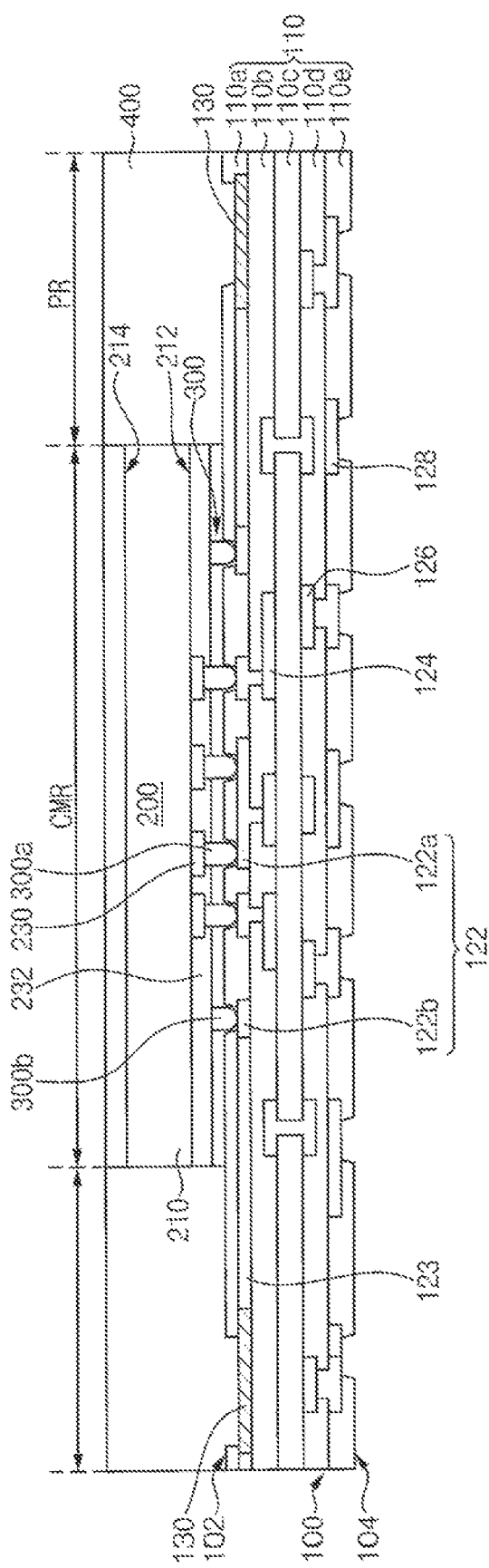

FIGS. 6 to 17 are views illustrating a method of manufacturing a semiconductor package in accordance with example embodiments. FIG. 8 is an enlarged cross-sectional view illustrating 'C' portion in FIG. 7. FIG. 9 is an enlarged cross-sectional view illustrating 'D' portion in FIG. 7. FIG. 12 is an enlarged plan view illustrating 'E' portion in FIG. 11. FIGS. 13, 14 and 17 are cross-sectional views taken along the line II-II' in FIG. 12. FIG. 16 is an enlarged cross-sectional view illustrating 'F' portion in FIG. 15.

Referring to FIG. 6, first, a wafer W including a plurality of semiconductor chips (dies) formed therein may be prepared.

In example embodiments, the wafer W may include a substrate 210 having a first surface 212 and a second surface 214 opposite to each other. Additionally, the wafer may include a front insulation layer formed on the first surface 212 of the substrate 210.

The substrate 210 may include a die region DA where circuit patterns and cells are formed and a scribe lane region SA surrounding the die region DA. As described later, the substrate 210 of the wafer W may be sawed along the scribe lane region SA dividing a plurality of the die regions DA.

For example, the substrate 210 may include may include silicon, germanium, silicon-germanium, or III-V compounds, e.g., GaP, GaAs, GaSb, etc. In some embodiments, the substrate 210 may be a silicon-on-insulator (SOI) substrate, or a germanium-on-insulator (GOI) substrate.

The circuit patterns may include a transistor, a diode, etc. The circuit patterns may constitute circuit elements. Accordingly, the semiconductor chip may be a semiconductor device in which a plurality of the circuit elements is formed. The circuit patterns may be formed by performing a front-end-of-line (FEOL) process for manufacturing a semiconductor device on the first surface 212, that is, active surface of the substrate 210. The surface of the substrate on which the FEOL process is performed may be referred to as a front side surface of the second substrate, and the surface opposite to the front surface may be referred to as a backside surface.

The front insulation layer as an insulation interlayer may be provided on the first surface 212 of the substrate 210 to cover the circuit patterns. The front insulation layer may include a plurality of insulation layers and upper wirings in the insulation layers. A chip pad 230 may be provided in the outermost insulation layer of the front insulation layer. The chip pad 230 may be electrically connected to the circuit element by the upper wirings. As will be described later, at least a portion of the chip pad 230 may serve as a landing pad on which a connection member such as a signal transmission bump is disposed.

Referring to FIGS. 7 to 9, connection members 300 may be formed on the first surface 212 of the substrate 210. The connection members 300 may include first bumps 300a that are the signal transmission bumps and second bumps 300b that are dummy support bumps.

As illustrated in FIG. 8, an insulation layer may be formed on the chip pads 230, and portions of the insulation layer may be removed to expose portions of the chip pads 230 to form an insulation layer pattern 232. Then, a first bump 300a may be formed on the portion of the chip pad 230 exposed by the insulation layer pattern. The first bump 300a may be electrically connected to the circuit pattern by the chip pad and the upper wiring to serve as the signal transmission bump. For example, the insulation layer may include photosensitive polyimide (PSPI). A protective layer pattern exposing the chip pad 230 may be formed under the insulation layer pattern.

When the insulation layer does not include a photosensitive material, a photoresist pattern for exposing the portion of the chip pad 230 may be formed on the insulation layer, and, a portion of the insulation layer may be removed using the photoresist pattern as an etching mask to expose the portion of the pad 230.

As illustrated in FIG. 9, second bumps 300b may be formed on the insulation layer pattern 232. The second bumps 300b may be formed on the insulation layer pattern 232 on a region where the chip pads 230 are not arranged. Because the second bumps 300b are formed on the insulation layer pattern 232, the second bumps may not be electrically connected to the circuit pattern. Accordingly, as will be described later, the second bump 300b may serve as a dummy support bump for supporting the semiconductor chip 200.

The first bump 300a and the second bump 300b may be formed together by the same process. For example, the first bumps 300a and the second bumps 300b may be formed by a plating process. According to another embodiment, the first bumps 300a and the second bumps 300b may be formed by a screen printing method, a vapor deposition method, etc.

For example, each of the first bump 300a and the second bump 300b may include a conductive pillar 310 as a lower bump and a solder 320 as an upper bump. The conductive pillar may include a copper pillar. The solder 320 may include, for example, tin (Sn), tin/silver (Sn/Ag), tin/copper (Sn/Cu), tin/indium (Sn/In), tin/silver/copper (Sn/Ag/Cu), etc.

Referring to FIG. 10, the wafer W may be sawed along the scribe lane region SA to form an individual semiconductor chip 200.

Referring to FIGS. 11 to 13, 15, a strip S including a plurality of mounting substrates for mounting the individual semiconductor chips 200 thereon may be provided.

In example embodiments, the mounting substrate may be a multilayer circuit board having an upper surface 102 and a lower surface 104 facing each other. For example, the mounting substrate may be a printed circuit board (PCB) including wirings respectively provided in a plurality of layers and vias connected to the wirings.

As illustrated in FIG. 11, the strip S may include a mounting region MR in which the semiconductor chips 200 are mounted respectively and a cutting region CR surrounding and provided adjacent to the mounting region MR. The strip S may be individualized into a semiconductor package by cutting the cutting region CR by a subsequent sawing process. For example, 50 to 500 semiconductor chips 200 may be mounted on one strip S. As will be described later, the semiconductor chips may be mounted on the strip S by a flip chip bonding method using a laser assisted bonding (LAB) process.

As illustrated in FIGS. 12 and 13, the mounting substrate may include a chip mounting region CMR in which the semiconductor chip 200 is mounted and a peripheral region PR. The mounting substrate may include a plurality of stacked insulation layers 110 and wirings 122, 124, 126 and 128 respectively provided in the insulation layers.

In particular, a first insulation layer 110a, a second insulation layer 110b, a third insulation layer 110c, a fourth insulation layer 110d, and a fifth insulation layer 110e may be sequentially stacked on one another. The first insulation layer 110a may be an upper cover insulation layer, the second insulation layer 110b may be an upper insulation layer, the third insulation layer 110c may be a core layer, the fourth insulation layer 110d may be a lower insulation layer, and the fifth insulation layer 110e may be a lower cover insulation layer.

A first wiring 122 may be formed on an upper surface of the second insulation layer 110b, and a second wiring 124 may be formed on an upper surface of the third insulation layer 110c. A third wiring 126 may be formed on a lower surface of the third insulation layer 110c, and a fourth wiring 128 may be formed on a lower surface of the fourth insulation layer 110d. For example, the wirings may include a metal material such as copper, aluminum, etc. Arrangements and numbers of the insulation layers and the wirings are examples, and embodiments are not limited thereto.

The first insulation layer 110a may be formed on the second insulation layer 110b to expose a portion of the first wiring 122. The portion of the first wiring 122 exposed by the first insulation layer 110a may serve as a substrate pad 120 to which the connecting members 300 are bonded by a subsequent LAB process.

The mounting substrate may include the substrate pads 120 and heat absorbing pads 130 provided in the upper surface 102. The substrate pads 120 may be arranged in the chip mounting region CMR, and the heat absorbing pads 130 may be arranged in the peripheral region PR. The heat absorbing pads 130 may be arranged to be spaced apart from each other along one side of the mounting substrate. The substrate pads 120 may include first substrate pads 122a to which the first bumps 300a are bonded respectively and second substrate pads 122b to which the second bumps 300b are bonded respectively.

Additionally, the mounting substrate may further include connection lines 123 that connect the second substrate pads 122b and the heat absorbing pads 130 to each other, respectively. For example, the heat absorbing pads 130 and the connection lines 123 may be provided in the same insulation layer. The heat absorbing pads 130 and the connection lines 123 may be formed on the upper surface of the second insulation layer 110b. The connection line 123 may include a thermally conductive material. The second substrate pad 122b may be thermally coupled to the heat absorbing pad 130 by the connection line 123. Accordingly, heat from the heat absorbing pad 130 may be transferred to the second substrate pad 122b through the connection line 123.

As illustrated in FIG. 12, the heat absorbing pads 130 may be arranged to be spaced apart from each other along the first side and the second side of the mounting substrate opposite to each other. The first substrate pads 122a may be arranged in a central region of the chip mounting region CMR, and the second substrate pads 122b may be arranged in a peripheral region of the chip mounting region CMR. However, embodiments are not limited thereto, and the second substrate pad 122b may be arranged between the first substrate pads 122a.

Referring to FIGS. 14 to 16, the semiconductor chips 200 may be mounted on the strip S.

In example embodiments, the semiconductor chips 200 may be mounted on the strip S by a flip chip bonding method using a LAB process.

In particular, a flux may be coated on surfaces of the first bump 300a and the second bump 300b on each of the semiconductor chips 200, and the semiconductor chips 200 may be disposed in the mounting regions MR of the strip S respectively. The first bump 300a and the second bump 300b may be interposed between the strip S and the semiconductor chip 200. The first bump 300a may be disposed on the first substrate pad 122a of the mounting substrate, and the second bump 300b may be disposed on the second substrate pad 122b of the mounting substrate.

As illustrated in FIG. 15, in order to perform the LAB process, the strip S on which the semiconductor chips 200 are disposed may be loaded on a stage 20 of a LAB system. A laser irradiator 30 of the LAB system may irradiate a laser L on a predetermined area of the strip S. The laser irradiator 30 may irradiate the laser L for a very short time of, for example, 1 second to 2 seconds on each area to heat the first bump 300a and the second bump 300b under the semiconductor chip 200 such that the first bump 300a and the second bump 300b are bonded to the first substrate pad 122a and the second substrate pad 122b, respectively. The laser irradiator 30 may perform the LAB process while sequentially moving by a preset interval along a scan direction.

As illustrated in FIG. 16, the laser irradiator 30 may irradiate the laser (L) on the semiconductor chip 200 and on the heat absorbing pads 130 formed in the peripheral region PR of the strip S, which is outside the semiconductor chip 200. The heat absorbing pad 130 may be heated by the irradiated laser L, and the heat H from the heat absorbing pad 130 may be transferred to the second bump 300b through the connection line 123 and the second substrate pad 122b.

Heat due to the laser L irradiated onto the semiconductor chip 200 may be sufficiently transferred to the first bump 300a through the chip pad 230 so that the first bump 300a may be better bonded to the first substrate pad 122a. However, since the second bump 300b is formed on the insulation layer pattern 232 such as PSPI with relatively low thermal conductivity, heat due to the laser L irradiated onto the semiconductor chip 200 may not be sufficiently transferred to the second bump 300b.

The heat H due to the laser L irradiated onto the heat absorbing pad 130 formed in the peripheral region PR of the strip S, which is outside the semiconductor chip 200, may be sufficiently transferred to the second bump 300b through the connection line 123 and the second substrate pad 122b. Accordingly, the second bump 300b may be heated to a relatively higher temperature to thereby greatly improve wetting between the second bump 300b and the second substrate pad 122a. Thus, the second bump 300b may also be better bonded to the second substrate pad 122b.

Referring to FIG. 17, a molding member 400 may be formed on the strip S to cover the semiconductor chips 200. For example, the molding member 400 may include an insulating material such as an epoxy molding compound.

Then, external connection members such as solder balls may be disposed on outer connection pads on the lower surface 104 of the package substrate 100, that is, portions of the fourth wirings 120d exposed by the fifth insulation layer 110e. The strip S may be cut along the cutting region CR by a sawing process to complete the semiconductor package 10 of FIG. 1.

Figure 18:
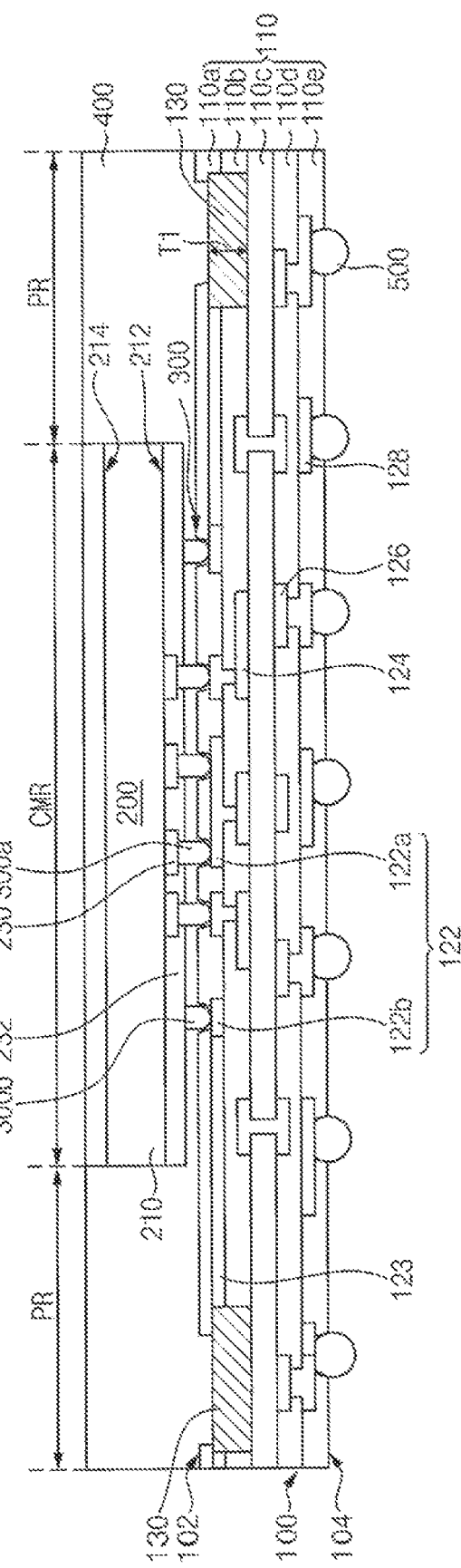
FIG. 18 is a cross-sectional view illustrating a semiconductor package in accordance with example embodiments.

FIG. 18 is a cross-sectional view illustrating a semiconductor package in accordance with example embodiments. The semiconductor package may be substantially the same as or similar to the semiconductor package described with reference to FIGS. 1 to 5 except for a configuration of the heat absorbing pad. Thus, same reference numerals will be used to refer to the same or like elements and any further repetitive explanation concerning the above elements will be omitted.

Referring to FIG. 18, a mounting substrate 100 of a semiconductor package 11 may include first substrate pads 122a and the second substrate pads 122b arranged in a chip mounting region CMR, heat absorbing pads 130 arranged in a peripheral region PR, and a connection line 123 that thermally couple the second substrate pad 122b and the heat absorbing pad 130 to each other.

In example embodiments, a thickness T of the heat absorbing pad 130 may be greater than a thickness of the second substrate pad 122b. The heat absorbing pad 130 may be provided on an upper surface of a third insulation layer 110c and the connection line 123 may be provided on a lower surface of a second insulation layer 110b. For example, the thickness T of the heat absorbing pad 130 may be equal to the sum of the thicknesses of the second insulation layer 110b and the third insulation layer 110c, however, embodiments are not limited thereto.

Since the heat absorbing pad 130 has a relatively large thickness, the heat absorbing pad may have a larger heat capacity. Accordingly, the heat absorbing pad 130 may absorb more heat from a laser during a LAB process, and may transfer the absorbed heat to a second bump 300b through the connection line 123 and the second substrate pad 122b. Thus, wetting between the second bump 300b and the second substrate pad 122a may be greatly improved.

Figure 19:
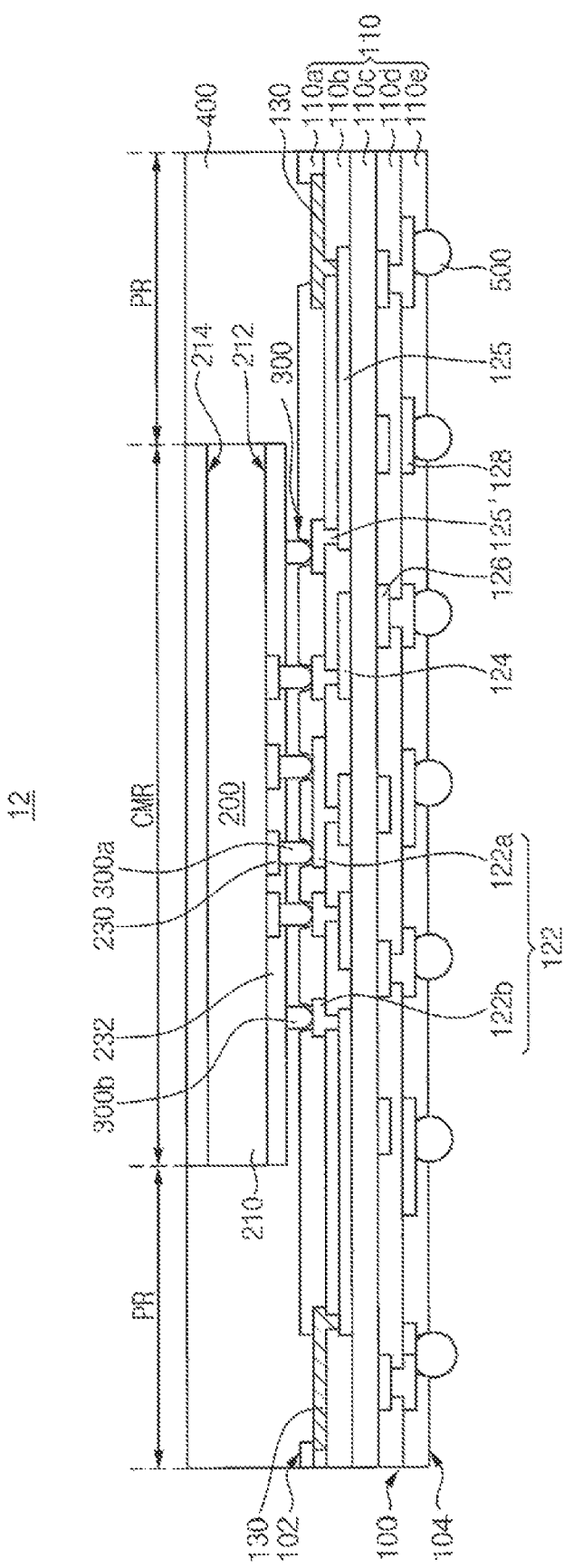
FIG. 19 is a cross-sectional view illustrating a semiconductor package in accordance with example embodiments.

FIG. 19 is a cross-sectional view illustrating a semiconductor package in accordance with example embodiments. The semiconductor package may be substantially the same as or similar to the semiconductor package described with reference to FIGS. 1 to 5 except for a configuration of the connection line. Thus, same reference numerals will be used to refer to the same or like elements and any further repetitive explanation concerning the above elements will be omitted.

Referring to FIG. 19, a mounting substrate 100 of a semiconductor package 12 may include first substrate pads 122a and the second substrate pads 122b arranged in a chip mounting region CMR, heat absorbing pads 130 arranged in a peripheral region PR, and a connection line 125 that thermally couple the second substrate pad 122b and the heat absorbing pad 130 to each other.

In example embodiments, the connection line 125 may be provided in an insulation layer different from an insulation layer on which the second substrate pad 122b is provided. The second substrate pad 122b and the heat absorbing pad 130 may be provided on an upper surface of a second insulation layer 110b, and the connection line 125 may be provided on an upper surface of a third insulation layer 110c, however, embodiments are not limited thereto. The connection line 125 may include a via structure 125' that thermally connects the second substrate pad 122b and the heat absorbing pad 130 provided respectively in the different insulation layers.

The connection line 125 may be routed to a different layer using the via structure 125' to thermally connect the heat absorbing pad 130 and the second substrate pad 122b to each other. Accordingly, the heat absorbing pad 130 and the second substrate pad 122b may be thermally connected to each other without significantly changing a layout of the wirings of the mounting substrate 100.

Figure 20:
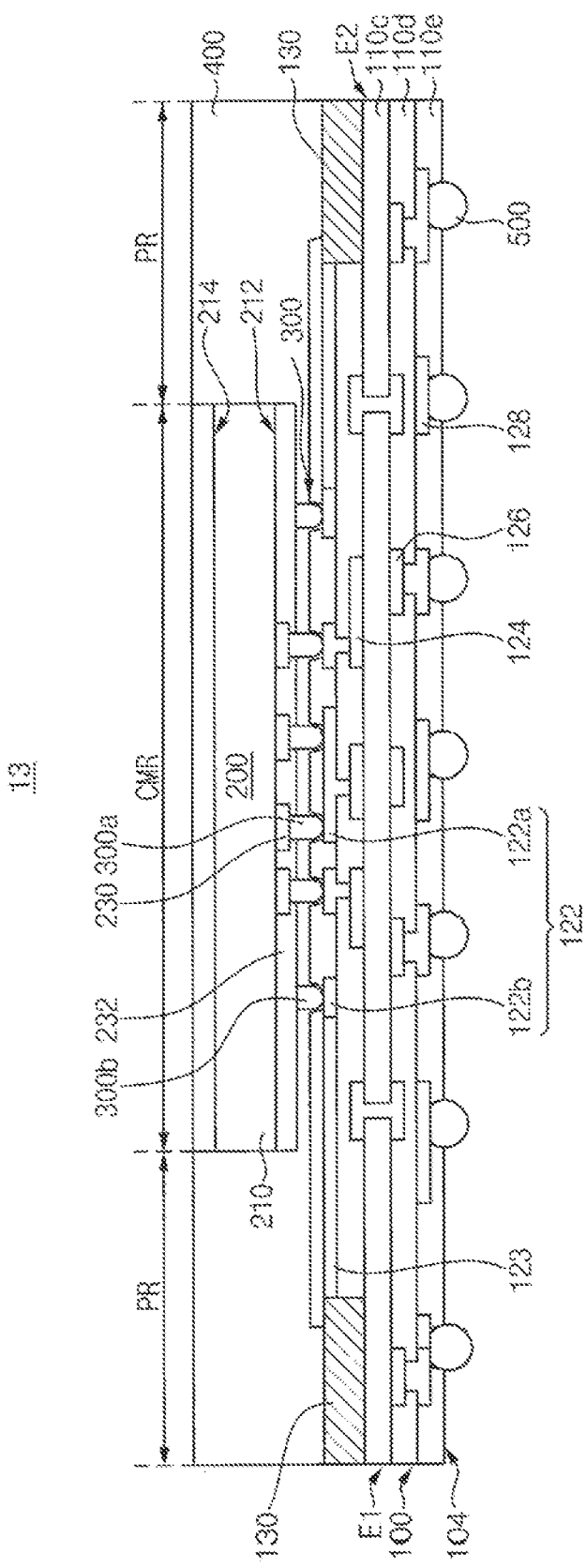
FIG. 20 is a cross-sectional view illustrating a semiconductor package in accordance with example embodiments.
Figure 21:
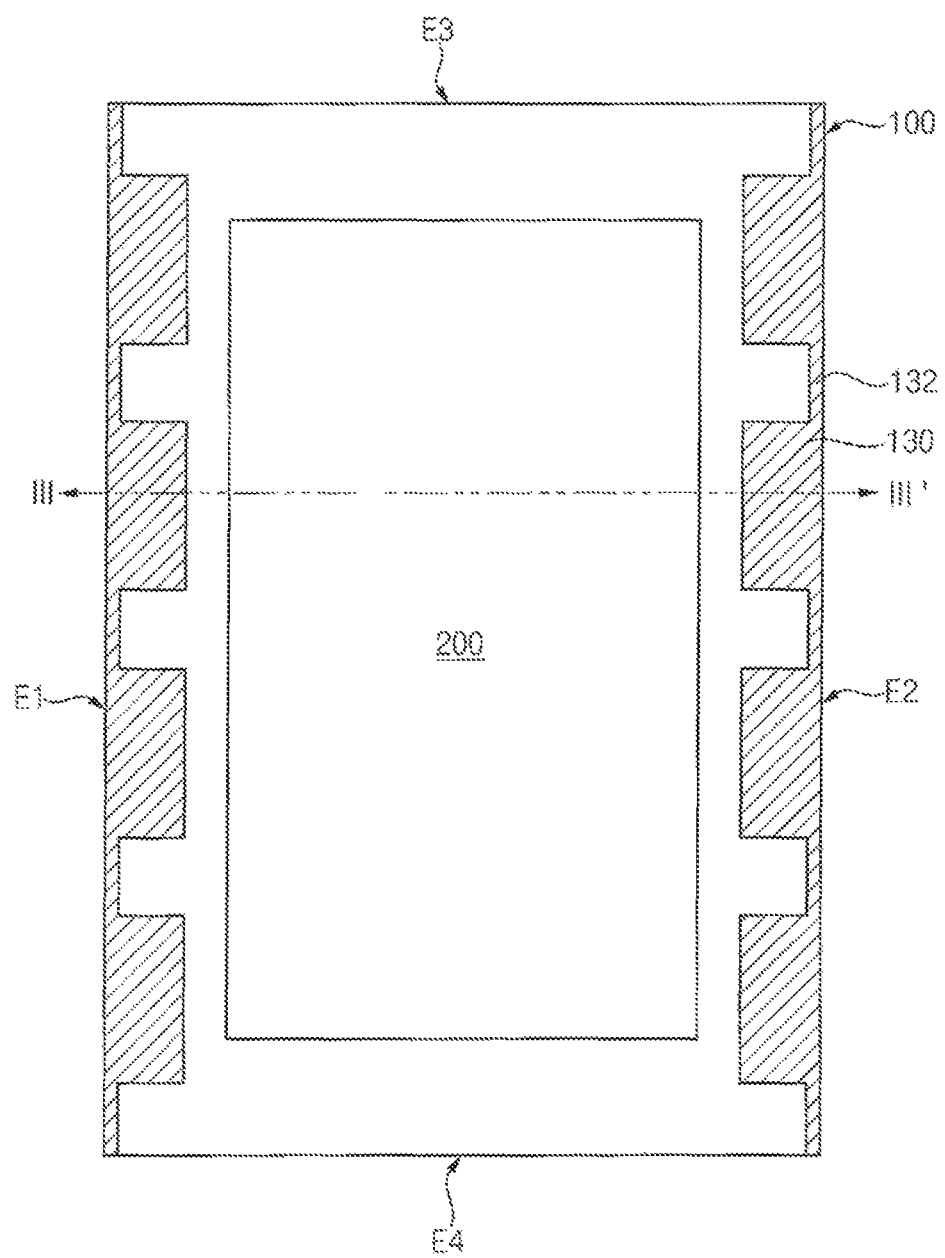
FIG. 21 is a plan view illustrating the semiconductor package in FIG. 20.

FIG. 20 is a cross-sectional view illustrating a semiconductor package in accordance with example embodiments. FIG. 21 is a plan view illustrating the semiconductor package in FIG. 20. The semiconductor package may be substantially the same as or similar to the semiconductor package described with reference to FIGS. 1 to 5 except for a configuration of the heat absorbing pad. Thus, same reference numerals will be used to refer to the same or like elements and any further repetitive explanation concerning the above elements will be omitted.

Referring to FIGS. 20 and 21, a mounting substrate 100 of a semiconductor package 13 may include first substrate pads 122a and the second substrate pads 122b arranged in a chip mounting region CMR, a heat absorbing pad portion arranged in a peripheral region PR, and a connection line 125 that thermally couple the second substrate pad 122b and the heat absorbing pad 130 to each other.

In example embodiments, the heat absorbing pad portion may include heat absorbing pads 130 arranged to be spaced apart from each other along one side of the mounting substrate 100 and a connection pad line 132 connecting the heat absorbing pads 130. For example, the heat absorbing pads 130 may be arranged to be spaced apart from each other along first side portion E1 and the second side portion E2 of the mounting substrate 100 opposite to each other.

An outer surface of the heat absorbing pad 130 may be exposed to the outside from one of the side portions E1 and E2 of the mounting substrate 100. In addition, the outer surface of the connection pad line 132 may also be exposed to the outside from one of the side portions E1 and E2 of the mounting substrate 100.

Hereinafter, a method of manufacturing the semiconductor package in FIG. 20 will be explained.

Figure 22:
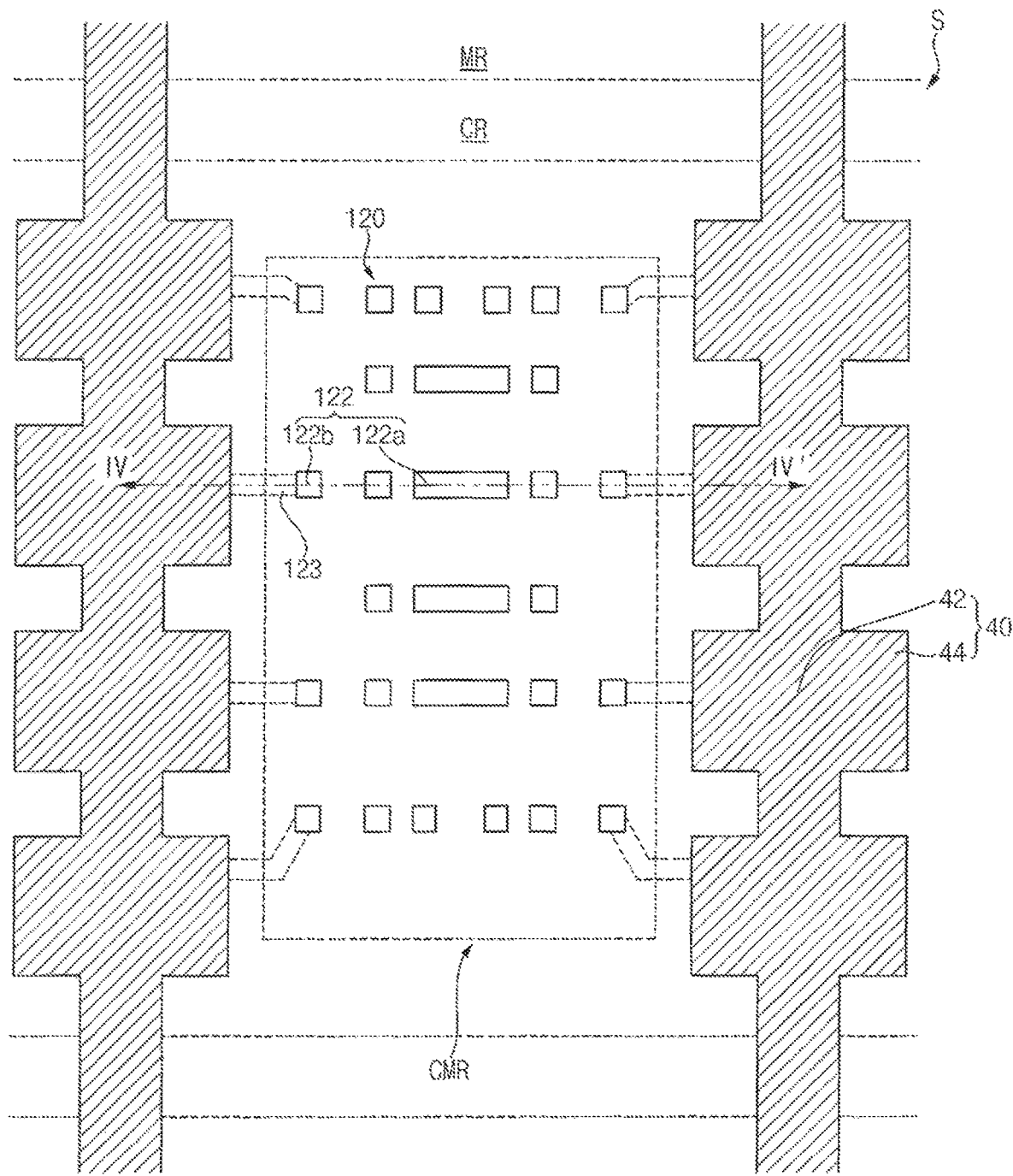
FIGS. 22, 23, and 24 are views illustrating a method of manufacturing a semiconductor package in accordance with example embodiments.
Figure 23:
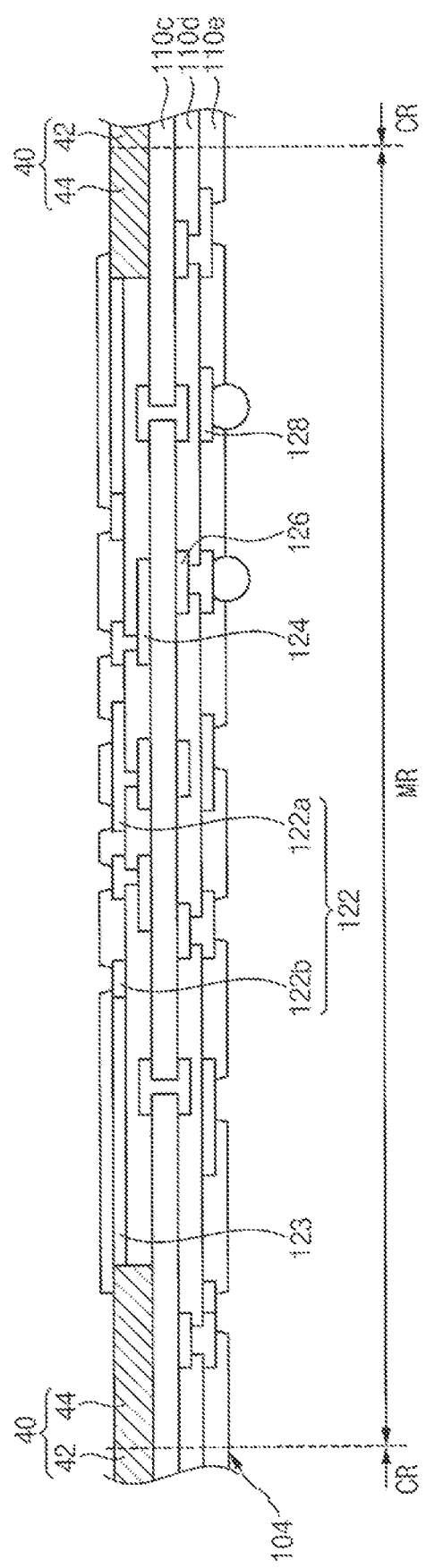
Figure 24:
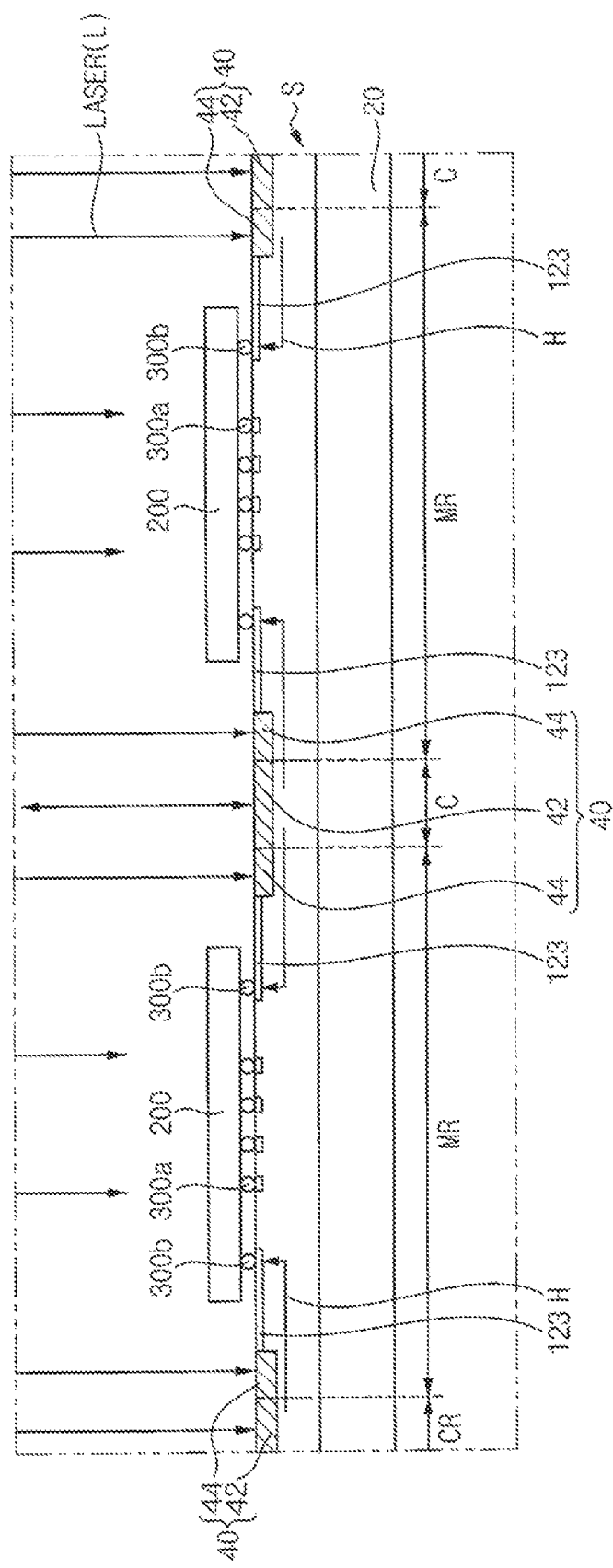

FIGS. 22 to 24 are views illustrating a method of manufacturing a semiconductor package in accordance with example embodiments. FIG. 23 is a cross-sectional view taken along the line IV-IV' in FIG. 22. FIG. 24 is a cross-sectional view illustrating a LAB process of irradiating a laser onto semiconductor chips disposed on a strip.

First, processes substantially the same as or similar to the processes described with reference to FIGS. 4 to 10 may be performed to provide a semiconductor chip 200 having first and second bumps formed thereon.

Referring to FIGS. 22 and 23, a strip S including a plurality of mounting substrates for mounting the individual semiconductor chips 200 thereon may be provided.

The strip S may include a mounting region MR in which the semiconductor chips 200 are mounted respectively and a cutting region CR surrounding and provided adjacent to the mounting region MR. The strip S may be individualized into a semiconductor package by cutting the cutting region CR by a subsequent sawing process. The mounting substrate may include a chip mounting region CMR in which the semiconductor chip 200 is mounted and a peripheral region PR.

The strip S may include substrate pads 120 and heat absorbing pad line 40 provided in an upper surface thereof.

The heat absorbing pad line 40 may include an extending pad portion 42 and a protruding pad portion 44. The extending pad portion 42 may extend in at least one direction along the cutting region CR. The protruding pad portion 44 may extend from the extending pad portion 42 into the mounting region MR. As will be described later, at least a portion of the extending pad portion 42 may be removed together with the cutting region CR of the strip S by the sawing process.

Referring to FIG. 24, the semiconductor chips 200 may be mounted on the strip S. The semiconductor chips 200 may be mounted on the strip S by a flip chip bonding method using a LAB process.

In particular, a flux may be coated on surfaces of the first bump 300a and the second bump 300b on each of the semiconductor chips 200, and the semiconductor chips 200 may be disposed in the mounting regions MR of the strip S respectively. The first bump 300a and the second bump 300b may be interposed between the strip S and the semiconductor chip 200. The first bump 300a may be disposed on a first substrate pad 122a of the mounting substrate, and the second bump 300b may be disposed on a second substrate pad 122b of the mounting substrate.

Then, in order to perform the LAB process, the strip S on which the semiconductor chips 200 are disposed may be loaded on a stage 20 of a LAB system. A laser irradiator 30 of the LAB system may irradiate a laser L on a predetermined area of the strip S. The laser irradiator 30 may irradiate the laser L for a very short time of 1 second to 2 seconds on each area to heat the first bump 300a and the second bump 300b under the semiconductor chip 200 such that the first bump 300a and the second bump 300b are bonded to the first substrate pad 122a and the second substrate pad 122b, respectively. The laser irradiator 30 may perform the LAB process while sequentially moving by a preset interval along a scan direction.

As illustrated in FIG. 24, the laser irradiator 30 may irradiate the laser (L) on the semiconductor chip 200 and on the heat absorbing pad line 40 formed in the peripheral region PR of the strip S, which is outside the semiconductor chip 200 and in the cutting region CR. The heat absorbing pad line 40 provided in the peripheral region PR and the cutting region CR may have a relatively large area. Accordingly, the heat absorbing pad line 40 may be heated by the irradiated laser L, and the heat H from the heat absorbing pad line 40 may be transferred to the second bump 300b through the connection line 123 and the second substrate pad 122b.

The heat H due to the laser L irradiated onto the heat absorbing pad line 40 having a relatively large area may be sufficiently transferred to the second bump 300b through the connection line 123 and the second substrate pad 122b. Accordingly, the second bump 300b may be heated to a relatively higher temperature to thereby greatly improve wetting between the second bump 300b and the second substrate pad 122a. Thus, the second bump 300b may be better bonded to the second substrate pad 122b.

As the bonding strengths of the second bumps are improved, a target temperature by the laser in the LAB process may be reduced. Accordingly, it may be possible to improve warpage of the strip after the LAB process, and decrease in yield due to thermal stress may be reduced or prevented.

Then, processes substantially the same as or similar to those described with reference to FIG. 17 may be performed to complete the semiconductor package 13 of FIG. 20.

As at least a portion of the extending pad portion 42 is removed together with the cutting region CR of the strip S by a sawing process, a heat absorbing pad 130 (see FIG. 20) is formed in the peripheral region PR of the mounting substrate. In addition, a connection pad line 132 that thermally connects the heat absorbing pads 130 to each other and extends along one side of the mounting substrate may be formed. An outer surface of the heat absorbing pad 130 may be exposed to the outside from the one side portion of the mounting substrate. Further, the outer surface of the connection pad line 132 may also be exposed to the outside from the one side portion of the mounting substrate.

The semiconductor package may include semiconductor devices such as logic devices or memory devices. The semiconductor package may include logic devices such as central processing units (CPUs), main processing units (MPUs), or application processors (APs), or the like, and volatile memory devices such as dynamic random-access memory (DRAM) devices, high bandwidth memory (HBM) devices, or non-volatile memory devices such as flash memory devices, parallel random-access memory (PRAM) devices, magnetoresistive random-access memory (MRAM) devices, resistive random-access memory (ReRAM) devices, or the like.

The foregoing is illustrative of example embodiments and is not to be construed as limiting thereof. Although example embodiments have been described, those skilled in the art will readily appreciate that many modifications are possible in example embodiments without materially departing from the novel teachings and advantages. Accordingly, all such modifications are intended to be included within the scope of example embodiments as defined in the claims and their equivalents.

What is claimed is:

1. A semiconductor package, comprising:
a mounting substrate including a substrate having an upper surface and a lower surface opposite to each other and including wirings provided respectively in a plurality of insulation layers, first substrate pads and second substrate pads on the upper surface arranged in a chip mounting region, heat absorbing pads, configured to absorb heat, on the upper surface arranged in a peripheral region surrounding the chip mounting region, and connection lines comprising conductive material and configured to transfer heat from the heat absorbing pads to the second substrate pads;
a semiconductor chip disposed within the chip mounting region of the mounting substrate; and
first and second bumps interposed between the semiconductor chip and the mounting substrate, the first and second bumps being bonded to the first and second substrate pads respectively,
wherein the second bump is thermally connected to the heat absorbing pad by the connection line and the second substrate pad.

2. The semiconductor package of claim 1, wherein the first bump is provided on a chip pad of the semiconductor chip, and the second bump is provided on an insulation layer pattern that exposes the chip pad.

3. The semiconductor package of claim 2, wherein the insulation layer pattern includes photosensitive polyimide.

4. The semiconductor package of claim 1, wherein the heat absorbing pads and the second substrate pads are provided in the same insulation layer.

5. The semiconductor package of claim 1, wherein the second substrate pad has a first thickness, and the heat absorbing pad has a second thickness greater than the first thickness.

6. The semiconductor package of claim 1, wherein a length of one side of the heat absorbing pad is within a range of 0.5 mm to 3.0 mm.

7. The semiconductor package of claim 1, wherein the connection line is provided in an insulation layer different from an insulation layer on which the second substrate pad is provided.

8. The semiconductor package of claim 7, wherein the connection line includes a via structure that thermally connects the second substrate pad and the heat absorbing pad to each other.

9. The semiconductor package of claim 1, wherein an outer surface of the heat absorbing pad is exposed to the outside from one side portion of the substrate.

10. The semiconductor package of claim 9, wherein the mounting substrate further includes a connection pad line that extends along the side portion of the substrate and connects the heat absorbing pads to each other.

* * * * *